(12) United States Patent
Miyajima et al.

(10) Patent No.: US 6,320,649 B1
(45) Date of Patent: *Nov. 20, 2001

(54) STAGE SYSTEM FOR EXPOSURE APPARATUS

(75) Inventors: Yoshikazu Miyajima, Utsunomiya; Yukio Tokuda, Kawasaki, both of (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/240,848

(22) Filed: Feb. 1, 1999

(30) Foreign Application Priority Data

Feb. 4, 1998 (JP) ............................... 10-023277

(51) Int. Cl.⁷ ............................ G03B 27/58; G03B 27/62
(52) U.S. Cl. ............................. 355/72; 355/76; 355/75
(58) Field of Search .................... 355/53, 67, 72, 355/75, 76, 30; 318/625, 628, 632, 687; 310/34

(56) References Cited

U.S. PATENT DOCUMENTS

| | | | |
|---|---|---|---|
| 4,655,594 | 4/1987 | Wittekoek et al. | 356/363 |
| 5,040,431 | 8/1991 | Sakino et al. | 74/479 |
| 5,228,358 | * 7/1993 | Sakino et al. | 74/479 R |
| 5,684,856 | * 11/1997 | Itoh et al. | 378/34 |
| 5,691,806 | * 11/1997 | Tokuda et al. | 355/72 |
| 5,828,142 | * 10/1998 | Simpson | 310/12 |
| 5,858,587 | * 1/1999 | Yamane et al. | 430/22 |
| 5,909,272 | * 7/1999 | Osanai et al. | 355/53 |
| 5,982,128 | * 11/1999 | Lee | 318/568.16 |

FOREIGN PATENT DOCUMENTS 9-5463   1/1997   (JP).

* cited by examiner

Primary Examiner—Russell Adams
Assistant Examiner—Hung Henry Nguyen
(74) Attorney, Agent, or Firm—Fitzpatrick, Cella, Harper & Scinto

(57) ABSTRACT

A stage system includes a movable stage having a static bearing and a magnet preloading mechanism, and a base having a guiding surface for guiding the movable stage. The base has an accumulated structure including a first layer of a magnetic material provided at the guiding surface, and a second layer of a non-magnetic material.

28 Claims, 17 Drawing Sheets

| BASE MATERIAL | YOUNG'S MODULUS (Kg/cm²) | THERMAL EXPANSION COEFFICIENT (1/°C) | SPECIFIC GRAVITY (g/cm²) | COST |
|---|---|---|---|---|
| ALUMINA CERAMICS | $37 \sim 41 \times 10^5$ | $7 \times 10^{-6}$ | 3.8 | |
| PERMALLOYS | $20 \times 10^5$ | $12 \times 10^{-6}$ | 8.75 | HIGH |
| SILICON STEEL | $20 \times 10^5$ | $12 \times 10^{-6}$ | 7.4 | LOW |

FIG. 6

STAGE SYSTEM FOR EXPOSURE APPARATUS

FIELD OF THE INVENTION AND RELATED ART

This invention relates to a stage system suitably usable in an exposure apparatus for the manufacture of semiconductor devices, for example. In another aspect, the invention is concerned with an exposure apparatus having such a stage system, or with a device manufacturing method using the same.

FIG. 17 shows a typical structure of a stage system used in an exposure apparatus. Denoted at 101 in the drawing is a wafer having a resist applied to the surface of a monocrystal silicon substrate. A reticle pattern formed on a reticle substrate is to be projected and transferred to the wafer through a reduction exposure system. Denoted at 102 is a fine-motion stage for fine adjustment of the wafer with respect to an optical axis direction of the reduction exposure system and to a rotational direction about the optical axis direction. Denoted at 103 is an X linear motion for moving the fine-motion stage in an X-axis direction. Denoted at 105 is a Y guide for guiding the fine-motion stage 102 and the X linear motor 103 in a Y-axis direction and a Z-axis direction. Denoted at 104a and 104b are Y sliders for moving the X linear motor 103 and Y linear motors 106a and 106b in the Y direction. Denoted at 107 (108, 110) is a stage base for supporting the fine-motion stage and the Y guide.

In FIG. 18, at the back of the fine-motion stage 102 where there is a scanning surface of the stage base 107, air pads 102a and preloading magnets 102b for applying preload to the stage are juxtaposed. As regards the air pads 102a, pressurized air is supplied through a pressurized air line 102c so that an air spring is formed uniformly at the pad surface of the air pads 102a. By this, the fine-motion stage 102 is floated, and without contact, it is supported movably in the X and Y directions. Also, at the back of the Y sliders 104a and 104b, there are air pads 104c and preloading magnets 104d for applying a preload to the Y sliders, juxtaposed with each other. They function to float the Y sliders 104a and 104b, such that without contact the sliders are supported movably in the X and Y directions.

The preloading magnets 102b comprise magnetic preloading magnets which serve to produce an attraction force for attracting the fine-motion stage 102, being floated by the air pads 102c, in a direction toward the stage base 107. Due to the floating force provided by the air pads 102c and the attraction force provided by the preloading magnets 102d, the floating gap is maintained substantially constant while motion in the X and Y directions is enabled. Similarly, the preloading magnets 104d comprise magnets for producing an attraction force for attracting the Y guides 104a and 104b, floated by the air pads 104c, in a direction toward the stage base 107. Due to the floating force provided by the air pads 104c and the attraction force provided by the preloading magnets 104d, the floating gap is maintained substantially constant, while motion in the X and Y directions is enabled.

The preloading magnets 102d and preloading magnets 104d produce a magnetically attracting force, for attraction toward the stage base 107, and perform magnetic preloading. If the product of a holding force Hc of the stage base 107 and saturation magnetic flux density B is large, the magnetic hysteresis becomes large and, as a result, during movement of the preloading magnets, a force is produced in a direction opposite to the movement direction, acting against the movement. If a movement load resulting from this magnetic hysteresis is large, there occurs a large loss of thrust of the X and Y linear motors. This leads to enlargement in size of the linear motor and, in addition thereto, enlargement of electric current to be applied to the linear motor. It causes a problem of large heat generation.

Japanese Laid-Open Patent Application, Laid-Open No. 5463/1997 shows a stage base made of alumina ceramics material. Since the alumina ceramics is a non-magnetic material, so that magnetic preloading is not attainable, vacuum preloading is used. However, as compared with the structure wherein preloading magnets are used, the structure using preloading pads comprising vacuum pads involves inconveniences such as follows. In order to produce an attraction force similar to that produced by the preloading magnets, it requires a large pad area as compared with the preloading magnet areas. Also, in addition to the pressurized air line, a vacuum line is necessary. As a result, the assembling at the bottom of the fine-motion stage where pads are to be mounted as well as the assembling of piping within the whole stage system are complicated. Moreover, use of a vacuum air of a high vacuum is necessary to obtain an attraction force similar to the preloading magnet. An air line of a high vacuum must be provided in the exposure apparatus.

SUMMARY OF THE INVENTION

It is an object of the present invention to provide an improved stage system by which, through improvement of the material or structure of a stage base, low cost as well as light weight and high rigidity are assured.

It is another object of the present invention to provide an exposure apparatus and/or a device manufacturing method using such a stage system.

In accordance with an aspect of the present invention, there is provided a stage system, comprising: a movable stage; and a base having a guiding surface for guiding said stage, wherein said base has an accumulated structure of different material layers.

In a preferred form of this aspect of the present invention, said movable stage may be guided by said guiding surface and through a static bearing and a magnet preloading mechanism.

The different material layers may include a first layer of a magnetic material provided at the guiding surface side, and a second layer of a non-magnetic material.

The different material layers may include a first layer of a magnetic material provided at the guiding surface side, and a second layer of a material having a smaller specific gravity as compared with the magnetic material.

The different material layers may include a first layer of a magnetic material provided at the guiding surface side, and a second layer of a material having a higher Young's modulus as compared with the magnetic material.

The material of the first layer may be permalloy or silicon steel.

The material of the second layer may be ceramics.

The different material layers may include a first layer of a permalloy or silicon steel material provided at the guiding surface side, and a second layer of ceramics material.

The ceramics material may include one of alumina ceramics, silicon nitride ceramics, zirconia, and silicon carbide.

The stage system may further comprise means for bonding the first and second layers to each other on the basis of vacuum attraction or electromagnetic attraction.

The bonding between the first and second layers may be releasable.

The bonding may be performed when an ambient temperature becomes substantially constant, when said stage system is placed movable, or in response to a signal from a stage control system.

The stage system may further comprise a third layer, below the second layer, of a material having substantially the same thermal expansion coefficient as that of the first layer.

The layers may be bonded to each other on the basis of one of a high melting point metal bonding method, an activated metal bonding method, an oxidization bonding method and an adhesion bonding method.

The second layer may have one of a bored rib structure and a hollow structure.

In accordance with another aspect of the present invention, there is provided an exposure apparatus, comprising: a base having a guiding surface; and a movable stage guided by said guiding surface, wherein said base has an accumulated structure having a first layer of a magnetic material provided at the guiding surface side, and a second layer of a non-magnetic material.

The movable stage may be guided by said guiding surface and through a static bearing and a magnet preloading mechanism.

The movable stage may be provided for at least one of a reticle stage for holding a reticle and a wafer stage for holding a wafer.

The reticle stage and the wafer stage may be scanningly moved relative to a projection optical system and at a predetermined speed ratio, whereby a pattern of the recticle is transferred to the wafer.

In accordance with a further aspect of the present invention, there is provided a device manufacturing method, comprising the steps of: preparing an exposure apparatus as described above; and performing an exposure process by use of the exposure apparatus.

The method may further comprise applying a resist to the wafer before the exposure process, and developing the wafer after the exposure process.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 6 is a chart of material physical properties for the stage base.

DESCRIPTION OF THE PREFERRED EMBODIMENTS

Preferred embodiments of the present invention will now be described with reference to the accompanying drawings.

[Embodiment 1]

Figure 1:
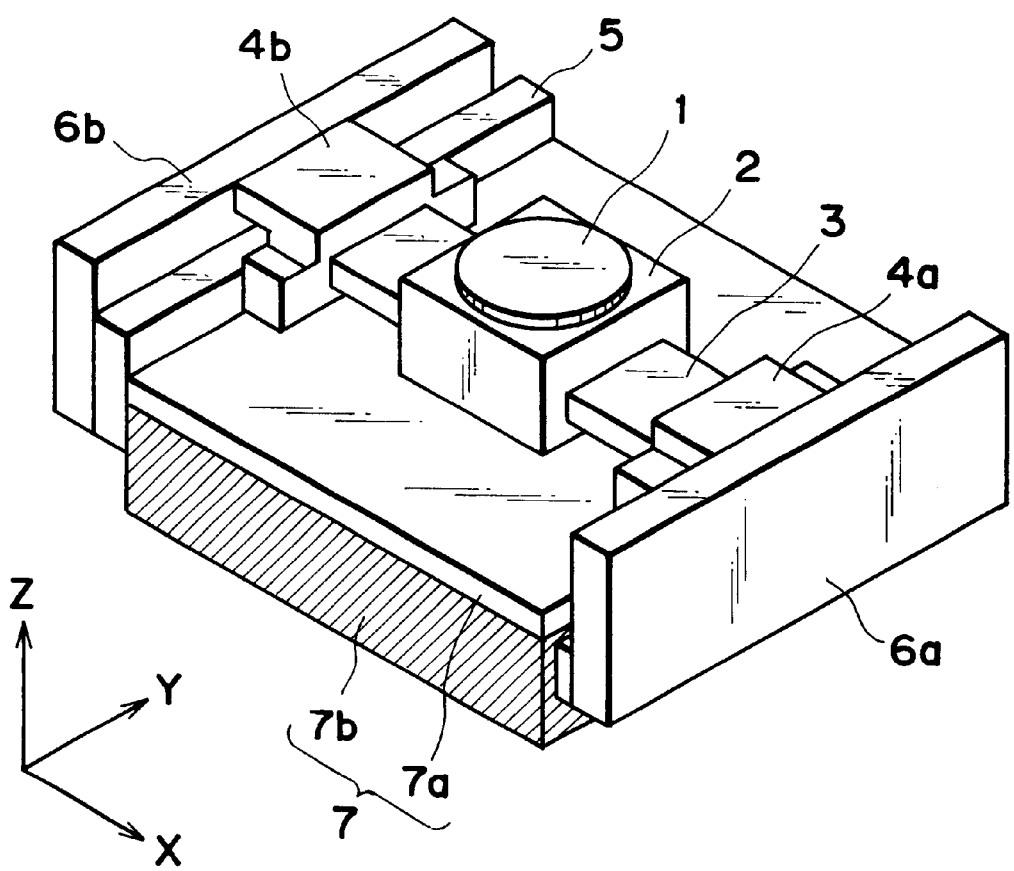
FIG. 1 is a schematic and perspective view of a stage system, as a whole, according to a first embodiment of the present invention.
Figure 2:
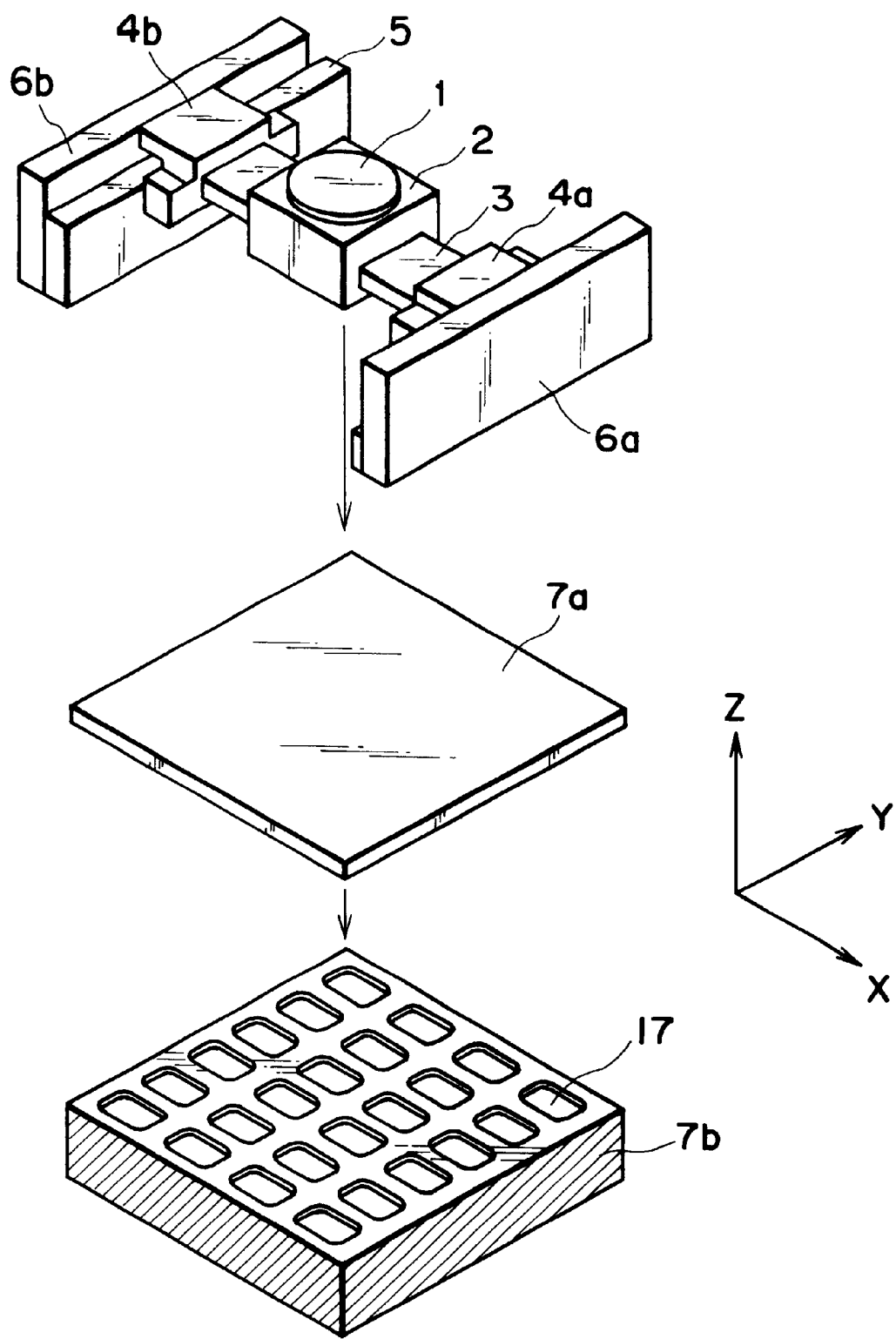
FIG. 2 is an exploded view of the stage system.
Figure 3A:
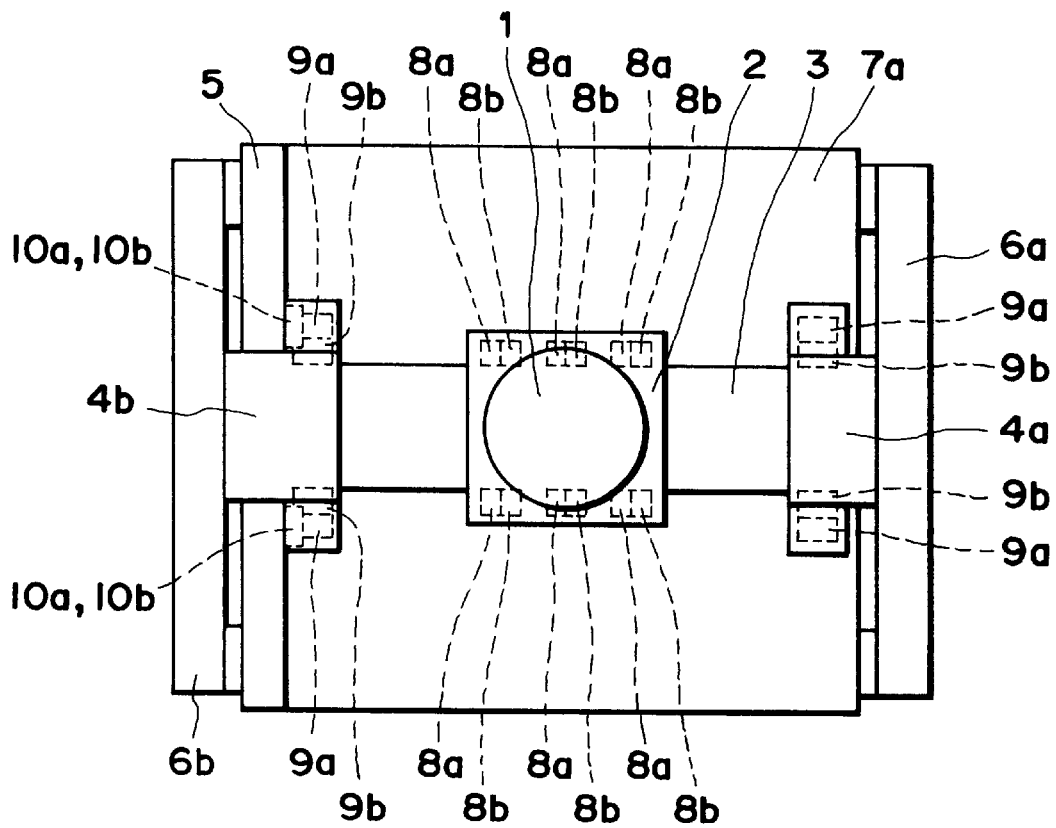
FIGS. 3A and 3B are a top plan view and a side view of the stage system.
Figure 3B:
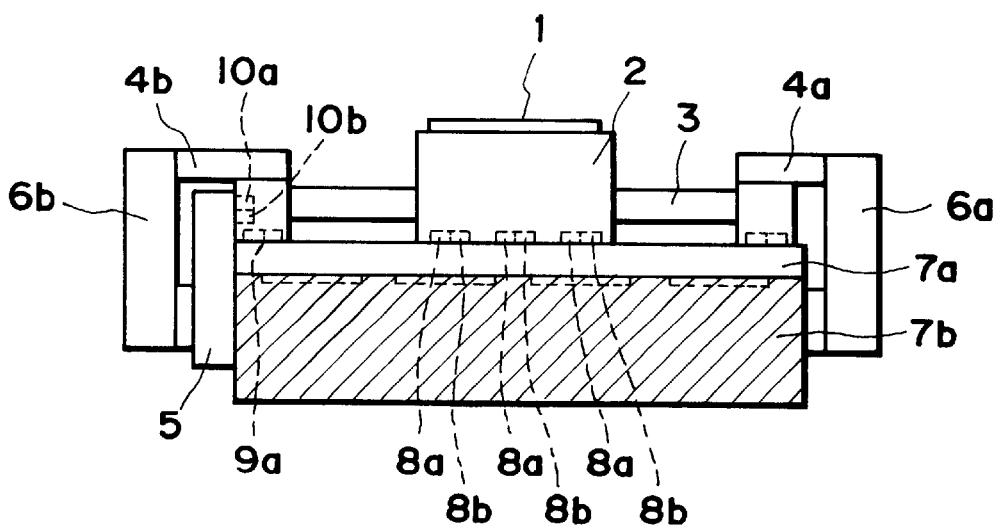
Figure 4:
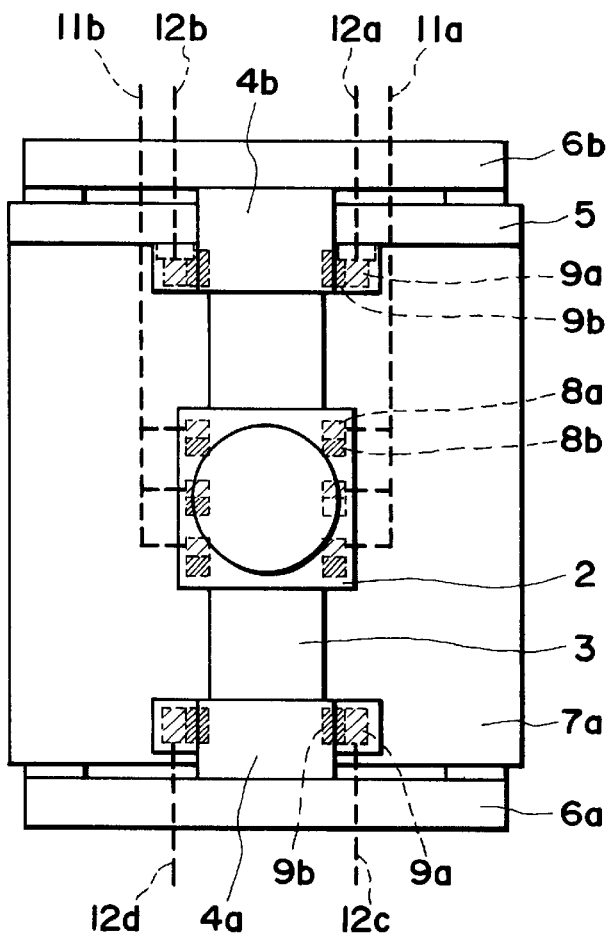
FIG. 4 is a schematic view for explaining air pads and preloading magnets at the bottom face of a fine-motion stage.
Figure 5:
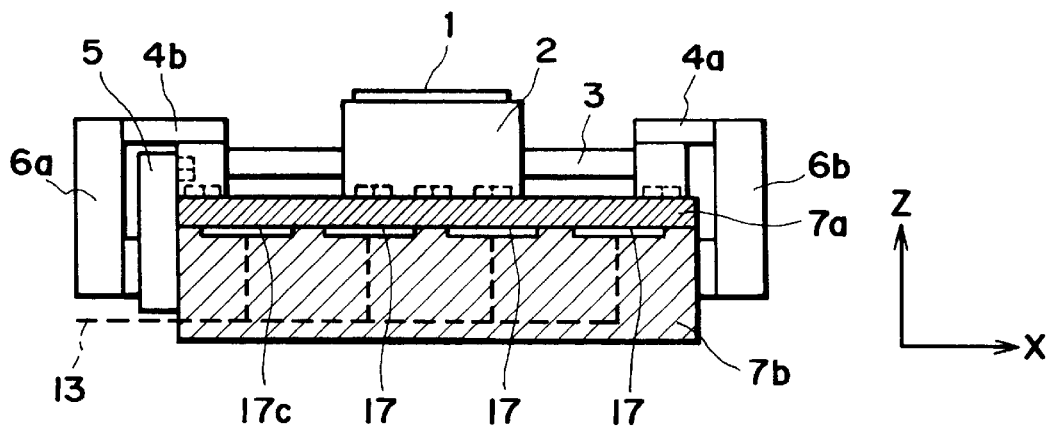
FIG. 5 is a side sectional view of an inside structure of a stage base.

FIG. 1 is a perspective view of a stage system for use in an exposure apparatus according to an embodiment of the present invention. FIG. 2 is an exploded view, and FIGS. 3A and 3B are a top plan view and a side view of the system, respectively. FIG. 4 illustrates the disposition of air pads and preloading magnets provided at the bottom face of a movable portion. FIG. 5 is a side view showing the inside structure of a stage base.

In FIGS. 1–3, denoted at 1 is a wafer having a resist applied to the surface of a monocrystal silicon substrate, and a reticle pattern formed on a reticle substrate is projected and transferred thereto through a reduction exposure system. Denoted at 2 is a fine-motion stage for fine adjustment of the wafer with respect to an optical axis direction of the reduction exposure system and to a rotational direction about the optical axis direction. Denoted at 3 is an X linear motor for moving the fine-motion stage in the X-axis direction. Denoted at 4a and 4b are Y guides for guiding the fine-motion stage 2 and the X linear motor 3 in the Y-axis direction and Z-axis direction. The X linear motor 3 is movable together with the Y linear motor 6a and Y sliders 4a and 4b in the Y direction. Denoted at 7 is a stage base for supporting the fine-motion stage and the Y guide. The stage base 7 has a double-layer structure comprising a base first layer 7a and a base second layer 7b.

In FIGS. 3–5, at the back of the fine-motion stage 2 where there is a scanning surface of the base first layer 7a, air pads 8a for discharging air and preloading magnets 8b for applying a preload to the fine-motion stage are provided in juxtaposition. As regards the air pads 8a, pressurized air is supplied through a pressurized air line 11a so that an air spring is formed uniformly at the pad surface. By this, a static bearing structure is defined in which the fine-motion stage 2 is floated and, without contact, it is supported movably in the X and Y directions. Also, at the back of the Y sliders 4a and 4b, similarly, there are air pads 9a and preloading magnets 9b for applying a preload to the Y sliders, juxtaposed with each other.

preloading magnets 8b provide a preloading magnet mechanism which serves to produce an attraction force for attracting the fine-motion stage 2, being floated by the air pads 8a, in a direction toward the stage base first layer 7a. Due to the floating force provided by the air pads 8a and the attraction force provided by the preloading magnets 8b, the floating gap is maintained substantially constant while motion in the X and Y directions is enabled. Similarly, the preloading magnets 9b comprise magnets for producing an attraction force for attracting the Y guides 4a and 4b, floated by the air pads 9a, in a direction toward the stage base first layer 7a. Due to the floating force provided by the air pads 9a and the attraction force provided by the preloading magnets 9b, the floating gap is maintained substantially constant, while motion in the X and Y directions is enabled.

The preloading magnets 8b and preloading magnets 9b produce a magnetically attracting force, for attraction toward the stage base first layer 7a. Here, if the product of holding force Hc of the stage base first layer 7a and saturation magnetic flux density B is large, the magnetic hysteresis becomes large and, as a result, during movement of the preloading magnets, a force is produced in a direction opposite to the movement direction, acting against the movement. If a movement load resulting from this magnetic hysteresis is large, there occurs a large loss of thrust of the X and Y linear motors. This leads to enlargement in size of the linear motor and, in addition thereto, enlargement of electric current to be applied to the linear motor. This causes a problem of large heat generation.

In consideration of the above, in this embodiment, a permalloy having a small holding force Hc is used for the base first layer 7a to thereby reduce the magnetic hysteresis. However, permalloy materials are very expensive as compared with ordinary steel materials, and the cost of the stage base will increase considerably. On the other hand, in order to prevent deformation of the stage base due to movement of the fine-motion stage 2, the stage base should have a certain rigidity. In consideration of this, as shown in FIGS. 1–3, the base first layer 7a is formed only with a thickness necessary for reducing the magnetic hysteresis while, on the other hand, a base second layer 7b made of alumina ceramics is provided below it, by which the rigidity of the stage base as a whole is assured.

FIG. 6 shows physical properties of permalloy and alumina ceramics usable as materials of the base first layer 7a and base second layer 7b. As regards the Young's modulus, which represents the rigidity of the material, it is seen that alumina ceramics show a value about twice higher than that of the permalloy. Therefore, the rigidity of the stage base can be improved, as compared with the structure wherein the whole stage base is made of a permalloy. Further, as regards the specific gravity, alumina ceramics show a level not greater than half of that of permalloy. Thus, the weight of the stage system can be lightened considerably, as compared with the structure wherein the whole stage base is made of a permalloy. This increases the latitude of rigidity of the main structure of the exposure apparatus that supports the stage system.

Namely, in accordance with the present embodiment, an advantageous effect of magnetic hysteresis reduction of the permalloy, but high cost, and an advantageous effect of a light weight and high rigidity stage base of alumina ceramics, but otherwise ineffective as a simple preloading mechanism, are combined satisfactorily while cancelling the disadvantages of these materials.

As regards the thermal expansion coefficient, these materials have a different. If, therefore, they are simply bonded into a stage base structure, there is a possibility that distortion deformation is produced in the base due to a change in ambient temperature inside the exposure apparatus, causing tilt of the fine-motion stage. If, for example, the base first layer and the base second layer are coupled to each other by using bolts, because of a difference in the thermal expansion coefficient between the materials of them, a change in surrounding temperature will cause a large deformation of the base first layer having a small rigidity. On that occasion, as the fine-motion stage moves in the X or Y direction, the fine-motion stage will cause displacement in the Z direction and tilt θ.

In consideration of the above, in this embodiment, as shown in FIG. 2, there are a plurality of vacuum air pads 17 provided on the top surface of the base second layer 7b. These vacuum air pads can be brought into a vacuum state through a vacuum air line 13 (FIG. 5), so that the base first layer 7a can be chucked to the base second layer 7b. This arrangement enables setting the timing for chucking and connecting them with each other, as desired. Chucking may be done at the moment whereat the inside temperature of the exposure apparatus becomes constant. This prevents interference in the stage base layers due to expansion deformation of them, attributable to the difference in the thermal expansion coefficient described before. Thus, deformation of the whole stage base can be prevented. The timing for chucking the base first layer 7a to the base second layer 7b may be other than the moment whereat the inside temperature of the exposure apparatus becomes constant. For example, chucking may be done in operation of the exposure apparatus or in response to a signal supplied from a stage control system of the exposure apparatus.

Vacuum air chucking may be used for chucking between the first layer and the base second layer, and between a reticle base first layer and reticle base second layer. In an alternative form, an ordinary electromagnetic chuck having an electromagnetic coil and an iron core may be provided at the position where the vacuum air pads on the alumina ceramics base side are provided. On that occasion, preferably, coil cooling means may be provided to prevent transmission of coil heat generation to the stage base.

The present invention is not limited to use of a permalloy for the base first layer. For example, silicon steel having a small holding force Hc, similar to permalloy, may be used.

Further, the present invention is not limited to the use of alumina ceramics for the base second layer 7b. For example, ceramics materials for ordinary structures such as silicon nitride ceramics, zirconia, or silicon carbide may be used. Alternatively, a low specific gravity and high rigidity material of a metal series, other than ceramics, such as, for example, titanium or magnesium may be used.

[Embodiment 2]

A second embodiment of the present invention will be described. Since it has many features similar to the first embodiment, distinctive features thereof will be mainly explained.

Figure 7:
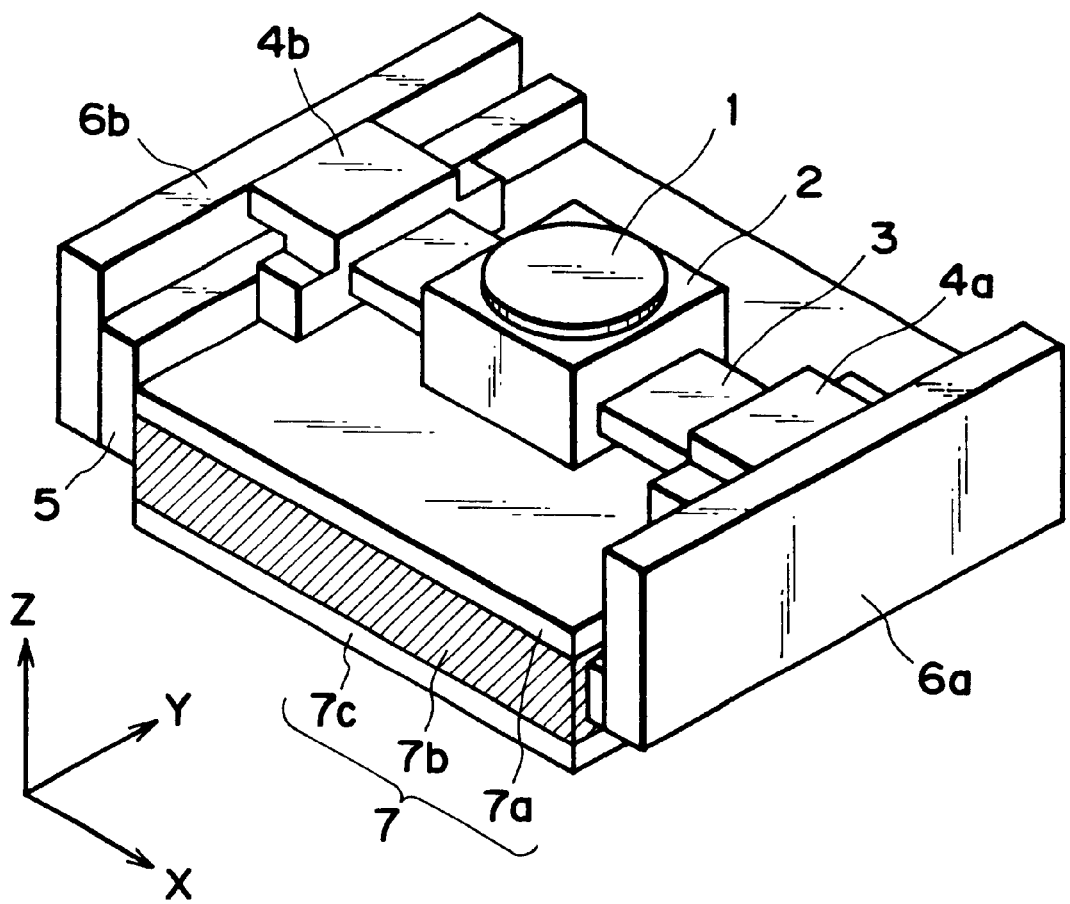
FIG. 7 is a schematic and perspective view of a stage system, as a whole, according to a second embodiment of the present invention.
Figure 8:
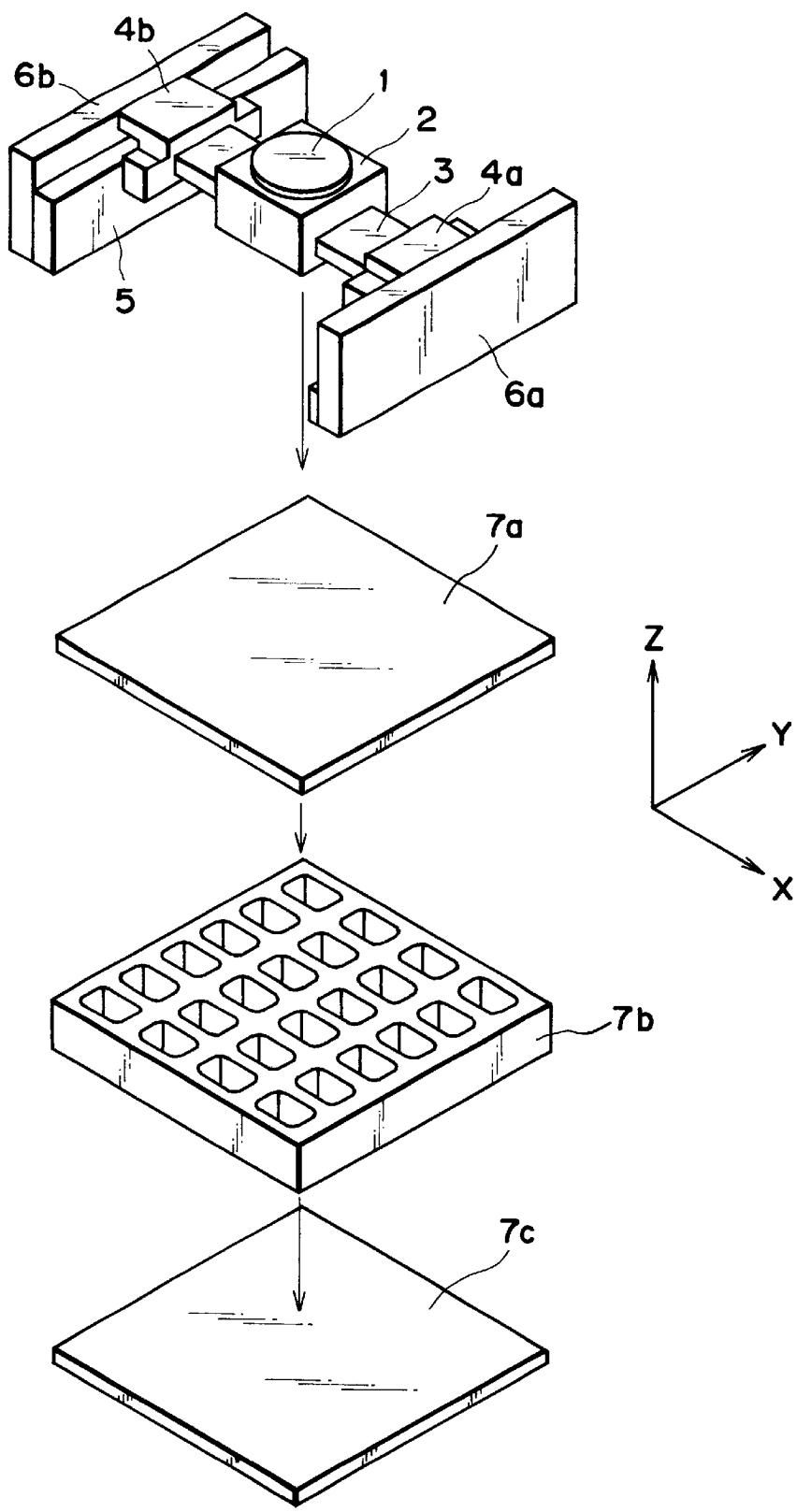
FIG. 8 is an exploded view of the stage system.
Figure 9A:
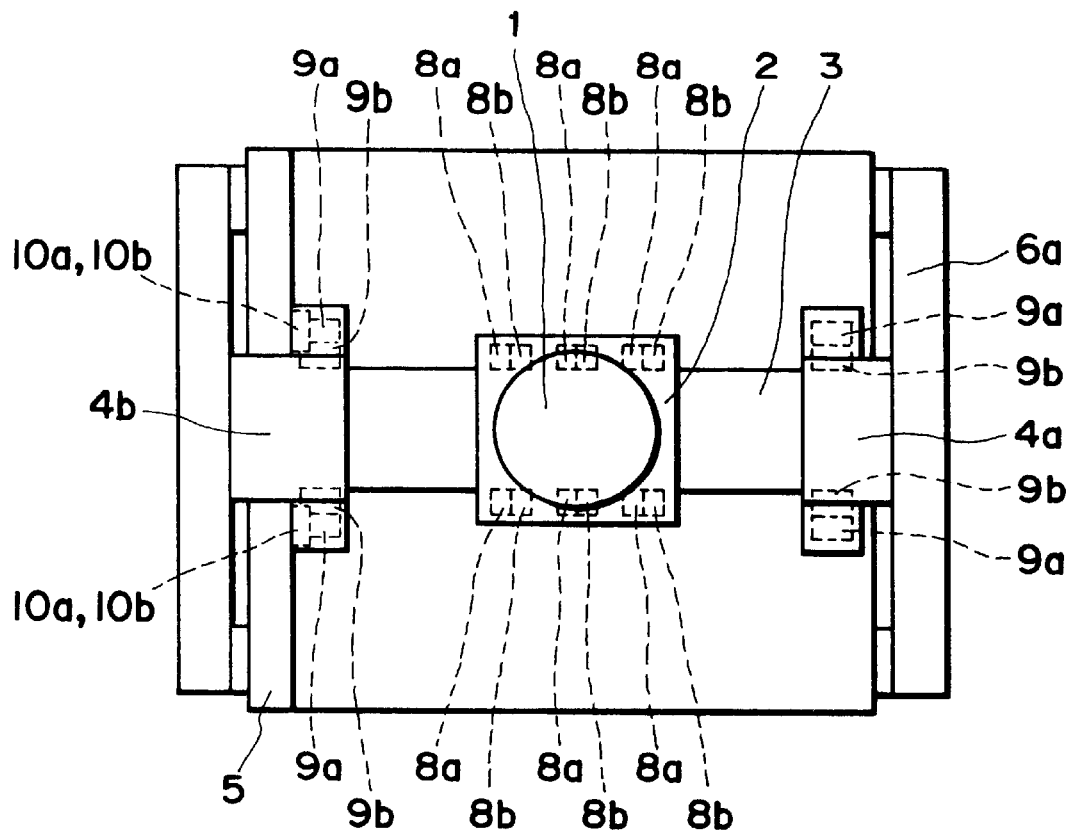
FIGS. 9A and 9B are a top plan view and a side view of the stage system.
Figure 9B:
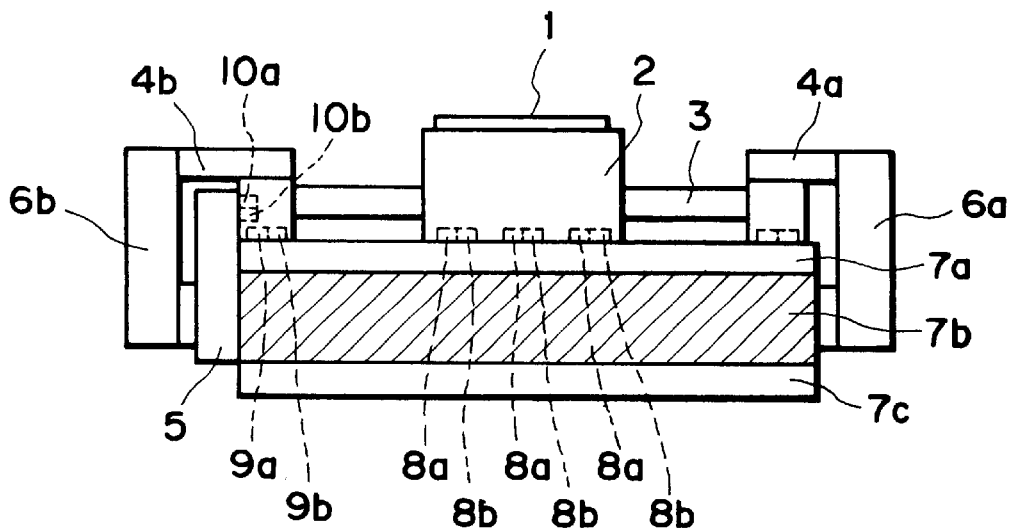

A distinctive feature over the preceding embodiment resides in an accumulation structure of the stage base. In FIGS. 7–9, denoted at 7 is a stage base for supporting and guiding a fine-motion stage and Y guide. It is provided by a triple-layer structure comprising a base first layer 7a, a base second layer 7b and a base third layer 7c. For reduction of weight, the base second layer 7b has a bored-rib structure such as shown in FIG. 8 or a hollow structure.

Preloading magnets 8b and preloading magnets 9b produce a magnetically attracting force, for attraction toward the stage base first layer 7a. Here, if the product of the holding force Hc of the stage base first layer 7a and saturation magnetic flux density B is large, the magnetic hysteresis becomes large and, as a result, during movement of the preloading magnets, a force is produced in a direction opposite to the movement direction, acting against the movement. If a movement load resulting from this magnetic hysteresis is large, there occurs a large loss of thrust of the X and Y linear motors. This leads to enlargement in size of the linear motor and, in addition thereto, enlargement of electric current to be applied to the linear motor. It causes a problem of large heat generation.

In consideration of the above, in this embodiment, permalloy having a small holding force Hc is used for the base first layer 7a to thereby reduce the magnetic hysteresis. However, permalloy materials are very expensive as compared with ordinary steel materials, and the cost of the stage base will increase considerably. On the other hand, in order to prevent deformation of the stage base due to movement of the fine-motion stage 2, the stage base should have a certain rigidity. In consideration of this, as shown in FIGS. 7–9, the base first layer 7a is formed only with a thickness necessary for reducing the magnetic hysteresis while, on the other hand, a base second layer 7b made of alumina ceramics is provided below it, by which the rigidity of the stage base as a whole is assured. Further, a base third layer 7c made of permalloy or an iron series material having a similar thermal expansion coefficient is provided, below it. These layers are bonded to each other.

Figure 10:
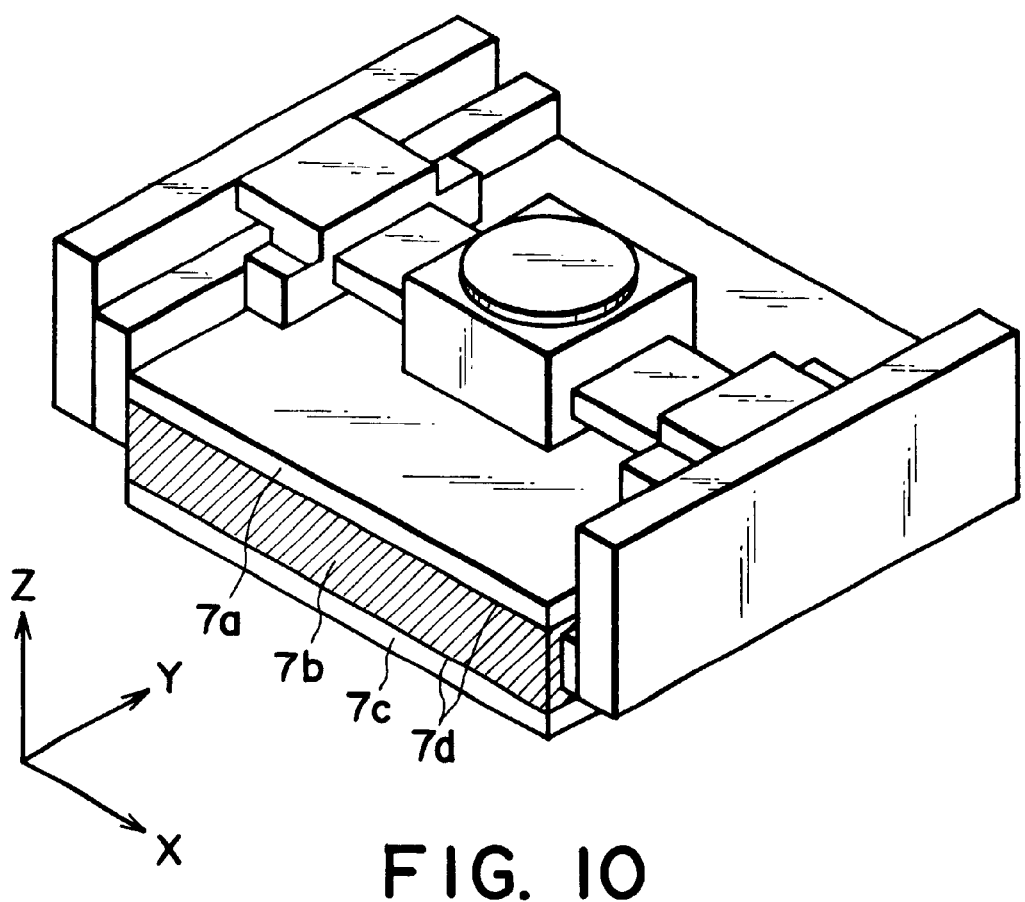
FIG. 10 is a schematic view for explaining bonding of layers of a stage base.

Some preferred examples will be explained with respect to the method of bonding layers of the stage base, with reference to FIG. 10. Any one of them may be used in this embodiment.

(A) High Melting Point Metal Bonding Method

| alumina ceramics | (7b) |
| Mo—Mn (metalizing layer) | (7d) |
| Ni plating | |
| Ag—Cu (solder layer) | |
| Ni plating | |
| Permalloy (silicon steel or pure iron, | |
| etc. (low Hc and high B)) | |

(B) Activated Metal Bonding Method

| alumina ceramics | (7b) |
| Ni—Ti (low melting point plus activated metal) | (7d) |
| Permalloy (silicon steel or pure iron, etc. | (7c or 7a) |
| (low Hc and high B) | |

(C) Oxidization Bonding Method

| alumina ceramics | (7b) |
| PbO, CaO—Al$_2$O$_3$—SiO$_3$—MgO (oxide solder) | (7d) |
| Permalloy (silicon steel or pure iron, etc. | (7c or 7a) |
| (low Hc and high B)) | |

(D) Adhesion Bonding Method

| alumina ceramics | (7b) |
| adhesive agent | (7d) |
| Permalloy (silicon steel or pure iron, etc. | (7c or 7a) |
| (low Hc and high B)) | |

Bonding method (A) is called a "High Melting Point Metal Bonding Method", in which, through good affinity or lyophilic between melted metal and an oxide such as alumina ceramics, the layers are bonded by thermodiffusion. On the bonding surface 7d of alumna ceramics, a metalizing layer of Mo—Mn is formed by high temperature sintering at 1300–1700 deg. in a forming gas ambience. On the alumina ceramics surface, Mo—Mn liquid metal is diffusion bonded. Further, Ni plating surface treatment is made to the metalizing layer. Ni plating surface treatment is made also to the bonding surface at the permalloy side. The bonding surfaces (Ni plating surfaces) of these layers are bonded by a solder layer of Ag—Cu, for example, by which the layers of the stage base are finally bonded to each other.

Bonding method (B) is called an "Activated Metal Bonding Method", in which, at the bonding surface between the alumina ceramics and permalloy, an activated metal layer composed of an activated metal and a low melting point such as Ni—Ti, for example, is provided. By heating in an inert gas ambience, Ti ions (activated metal) are diffused into ceramics and, additionally, Ni and ceramics are mutually diffused. By this, a glass phase is produced and mutual diffusion bonding is performed, such that layers of a stage base are finally bonded to each other.

Bonding method (C) is called an "Oxidization Bonding Method", in which an oxide of a composition such as mentioned above is put on between the bonding surfaces. By sintering at a temperature of 400–1500, depending on the melting point of the oxide, alumina of alumina ceramics is melted into the oxide whereby mutual diffusion bonding is accomplished, by which layers of the stage base are finally bonded to each other.

Bonding method (D) is called an "Adhesive Bonding Method" which uses an adhesive agent. Between the bonding surfaces of ceramics and permalloy, an epoxy series adhesive agent, for example, providing good adhesion between them, is applied, by which theses surface are bonded to each other.

Permalloy and alumina ceramics usable as materials of the layers 7a, 7b and 7c of the stage base have physical properties shown in FIG. 6, as described. As regards the Young's modulus, which represents the rigidity of the material, it is seen that alumina ceramics shows a value about twice higher than that of permalloy. Therefore, the rigidity stage base can be improved, as compared with the structure wherein the whole stage base is made of permalloy. Further, as regards the specific gravity, alumina ceramics shows a level not greater than a half of that of permalloy. Thus, the weight of the stage system can be lightened considerably, as compared with the structure wherein the whole stage base is made of permalloy. This increases the latitude of rigidity of the main structure of the exposure apparatus that supports the stage system.

Namely, in accordance with the present embodiment, an advantageous effect of magnetic hysteresis reduction of the permalloy, but high cost, and an advantageous effect of a light weight and high rigidity stage base of alumina ceramics, but otherwise ineffective as a simple preloading mechanism, are combined satisfactorily while cancelling disadvantages of these materials.

Figure 11A:
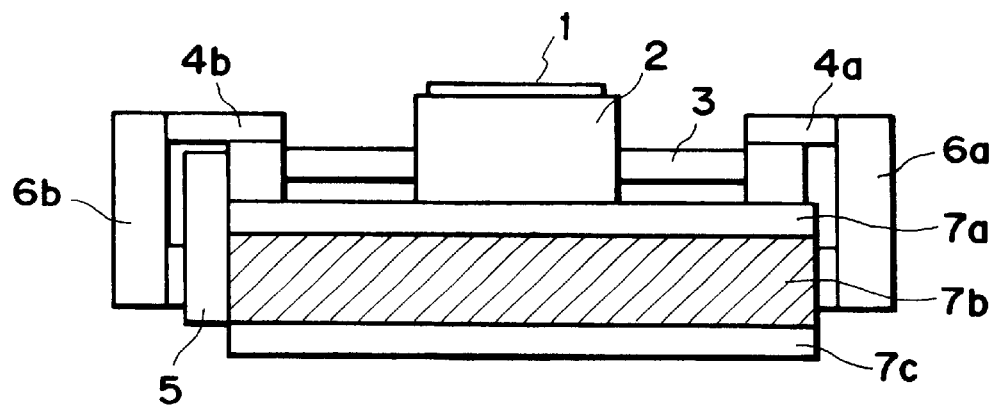
FIGS. 11A–11C are schematic and side views of the stage base, respectively.
Figure 11B:
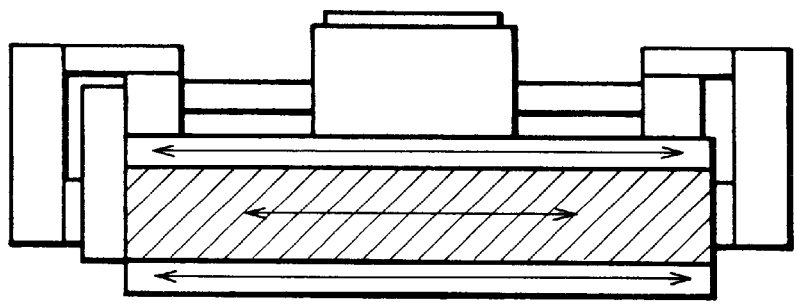
Figure 11C:
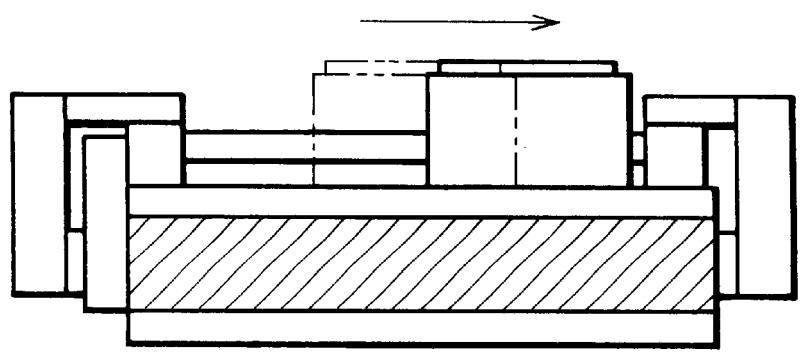

As regards the thermal expansion coefficient, these materials have a difference as described hereinbefore. If, therefore, they are simply bonded into a stage base structure, there is a possibility that distortion deformation is produced in the base due to a change in ambient temperature inside the exposure apparatus, causing tilt of the fine-motion stage. In consideration of the above, in this embodiment, to the upper and lower faces of the base second layer (alumina ceramics), the base first layer and the base third layer (permalloy layers)

are bonded symmetrically. As a result of this structure, distortion to be produced at the bonding surfaces of these layers due to a difference in the thermal expansion coefficient between alumina ceramics and permalloy, is produced symmetrically at the bonding surfaces on the upper and lower faces of the base second layer, such as illustrated in FIG. 11B. Namely, distortion deformation is produced in a direction or directions cancelling distortions at respective bonding surfaces. Consequently, no distortion deformation is produced in the layers, such that the fine-motion stage can be moved without any change in posture such as shown in FIG. 11C.

In this embodiment, alumina ceramics is used for the base second layer. However, the present invention is not limited to this. For example, ceramics materials for ordinary structures such as silicon nitride or, alternatively, a low specific gravity and high rigidity material of a metal series, other than ceramics, such as, for example, titanium or magnesium, may be used.

[Embodiment 3]

Figure 12:
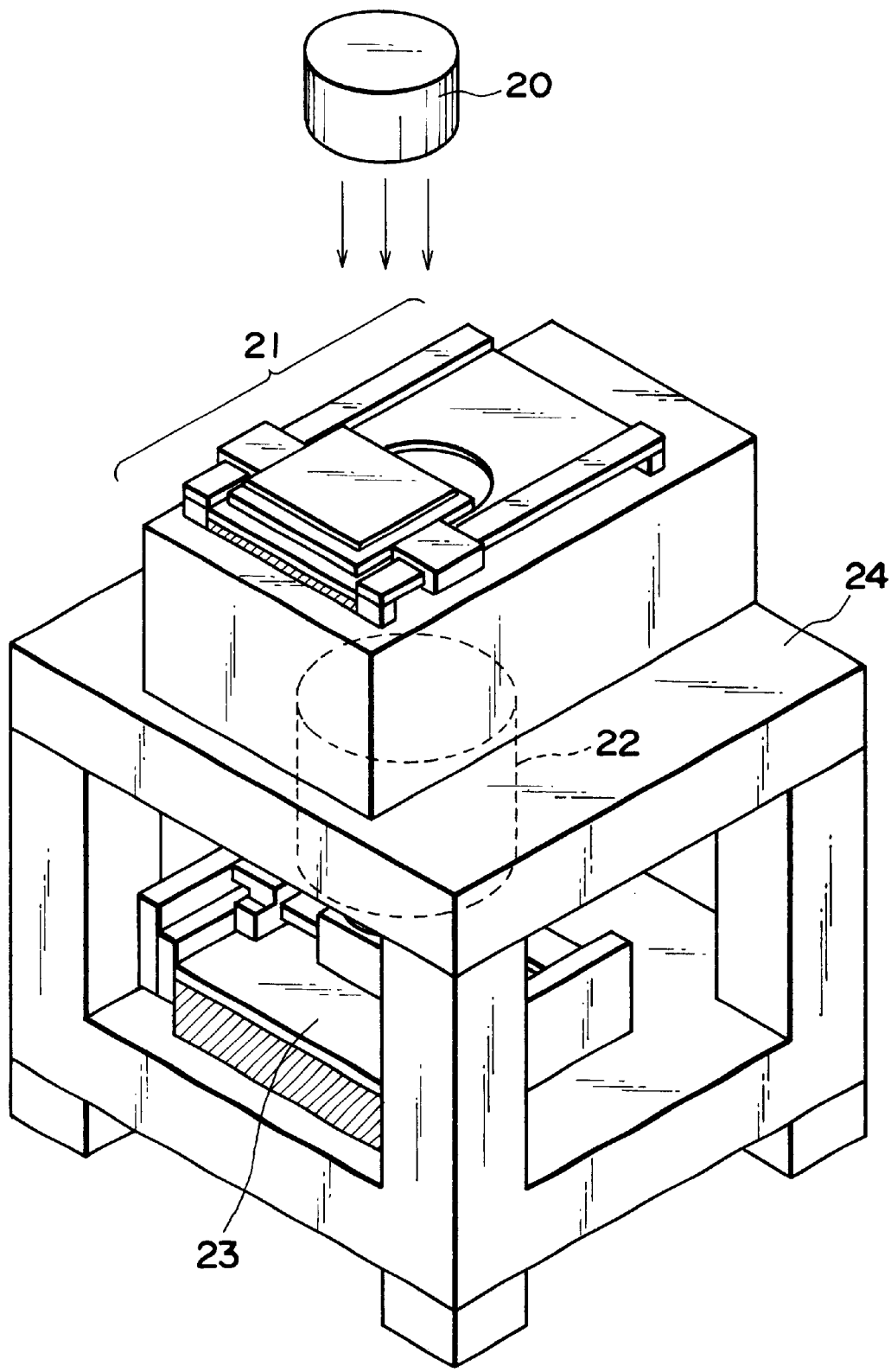
FIG. 12 is a schematic view of a scanning exposure apparatus according to an embodiment of the present invention.
Figure 13:
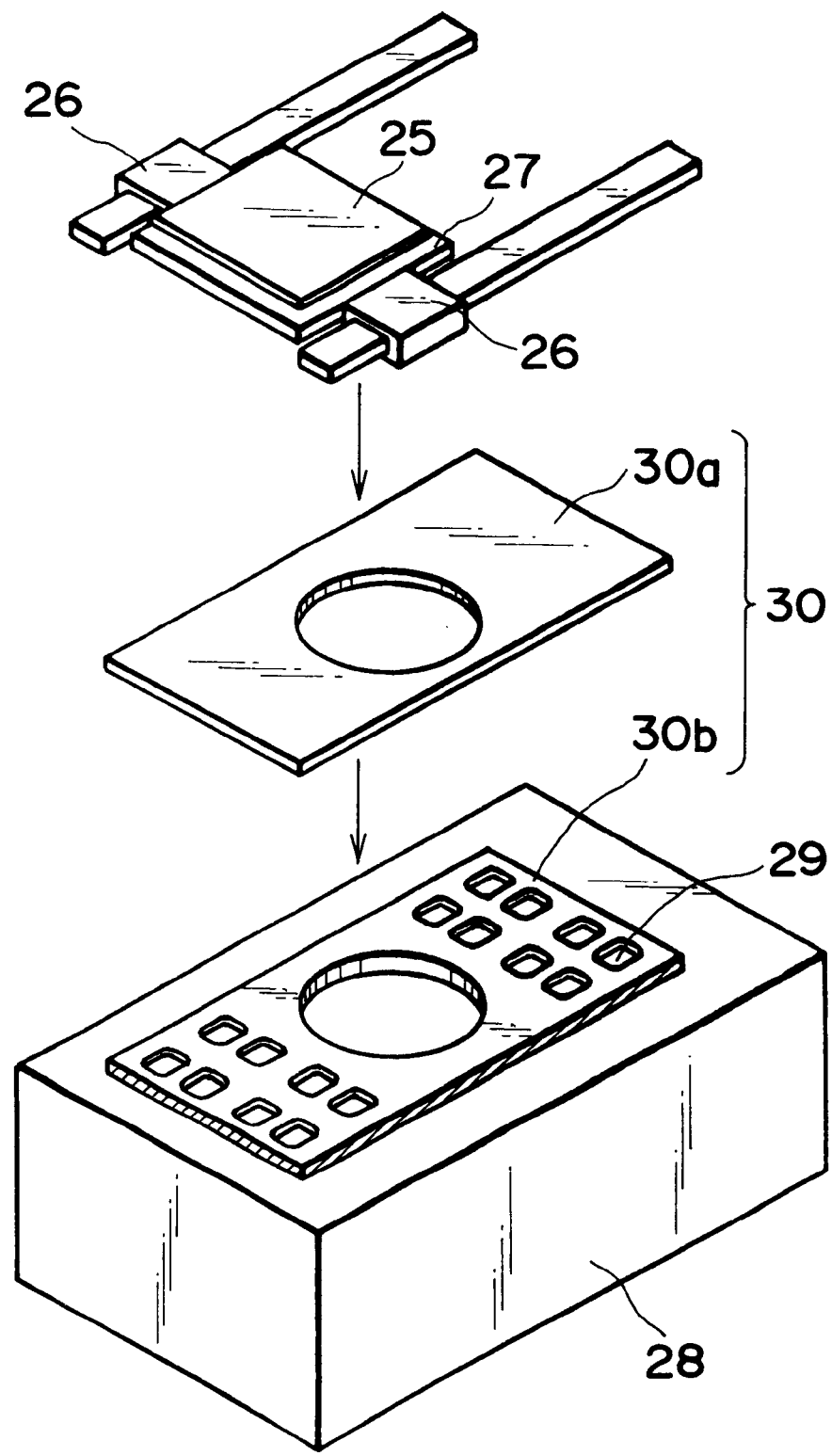
FIG. 13 is an exploded view of a reticle stage system with a double-layer base structure.
Figure 14:
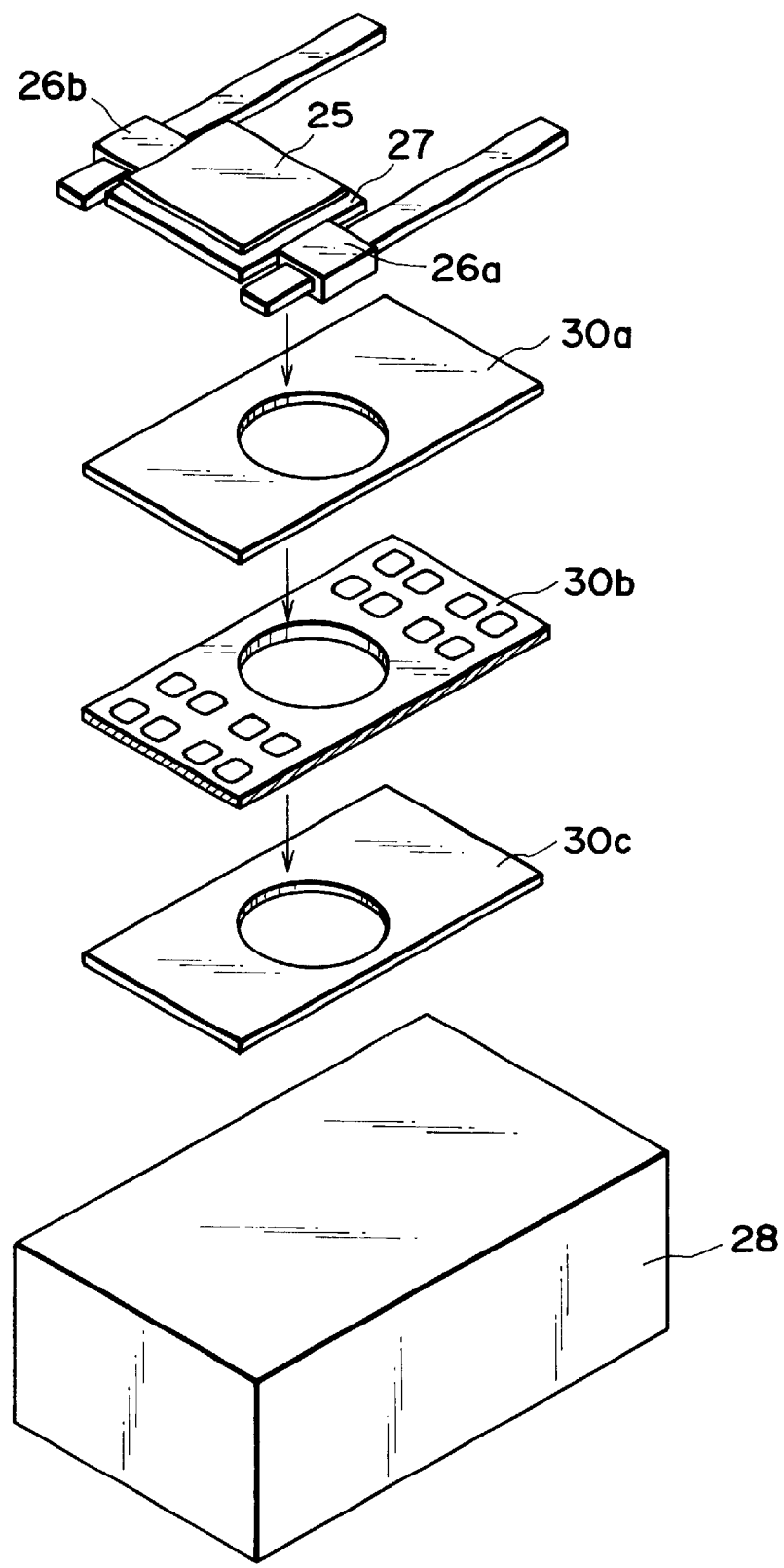
FIG. 14 is an exploded view of a reticle stage system with a triple-layer base structure.

The present invention has been described in the foregoing with reference to a wafer stage. However, the present invention is also similarly applicable to a reticle stage. FIG. 12 shows an embodiment of it.

FIG. 12 shows an exposure apparatus in which a reticle placed on a reticle stage 21 is illuminated by an illumination optical system 20, and a portion of the recticle pattern is projected onto a wafer, placed on a wafer stage 23, in a reduced scale by a projection optical system 22. The reticle stage 21 and the wafer stage 23 are scanningly moved in synchronism with each other at a predetermined speed ratio, relative to the projection optical system 22. By this, the pattern of the reticle is transferred to a single shot region on the wafer. This operation is repeated for all plural shot regions on the wafer. Thus, the exposure apparatus is called a "step-and-scan type".

Here, the reticle stage has a base formed with an accumulation structure similar to any one of the preceding embodiments described hereinbefore. If, therefore, it is formed with a double-layer structure according to the first embodiment, then it has an accumulation structure comprising a base first layer 30a of a permalloy and a base second layer 30b of alumina ceramics. If it is formed with a triple-layer like the second embodiment, it has an accumulation structure comprising a base first layer 30a of permalloy, a base second layer 30b of alumina ceramics and a base third layer 30c of permalloy or pure iron.

The reticle stage 2 comprises a stage 27 for supporting a reticle substrate (original) 25. The stage 27 can be moved for scan movement by linear motors 19 provided on the opposite sides thereof. The linear motors 19 are supported by a base 30 which is supported by a base table 28. Similarly to the wafer stage, the stage 27 is guidingly floated by the reticle base 30 and by means of a static bearing of air pads (not shown) and a magnet preloading mechanism of preloading magnets, for applying a preload to the stage.

Provided on the top surface of the reticle base second layer 30b are vacuum air pads 29 for vacuum chucking the reticle base first layer 20. The timing for chucking may be similar to that of the wafer stage, that is, at the moment whereat the inside temperature of the exposure apparatus becomes constant. By this, a reticle stage base of a small hysteresis, light weight, high rigidity and no distortion deformation, is accomplished. This embodiment is not limited to the use of vacuum chucking based on vacuum air pads. An electromagnetic chucking mechanism may be used.

Since the influence of magnetic hysteresis loss due to movement of a movable portion is reduced as described, exposure transfer precision in scan exposure wherein exposure is performed while moving the reticle stage and the wafer stage in synchronism, can be improved particularly and significantly. Thus, this embodiment as applied to a scan type exposure apparatus provides a notable advantageous result.

[Embodiment 4]

Next, an embodiment of a device manufacturing method which uses an exposure apparatus such as described above, will be explained.

Figure 15:
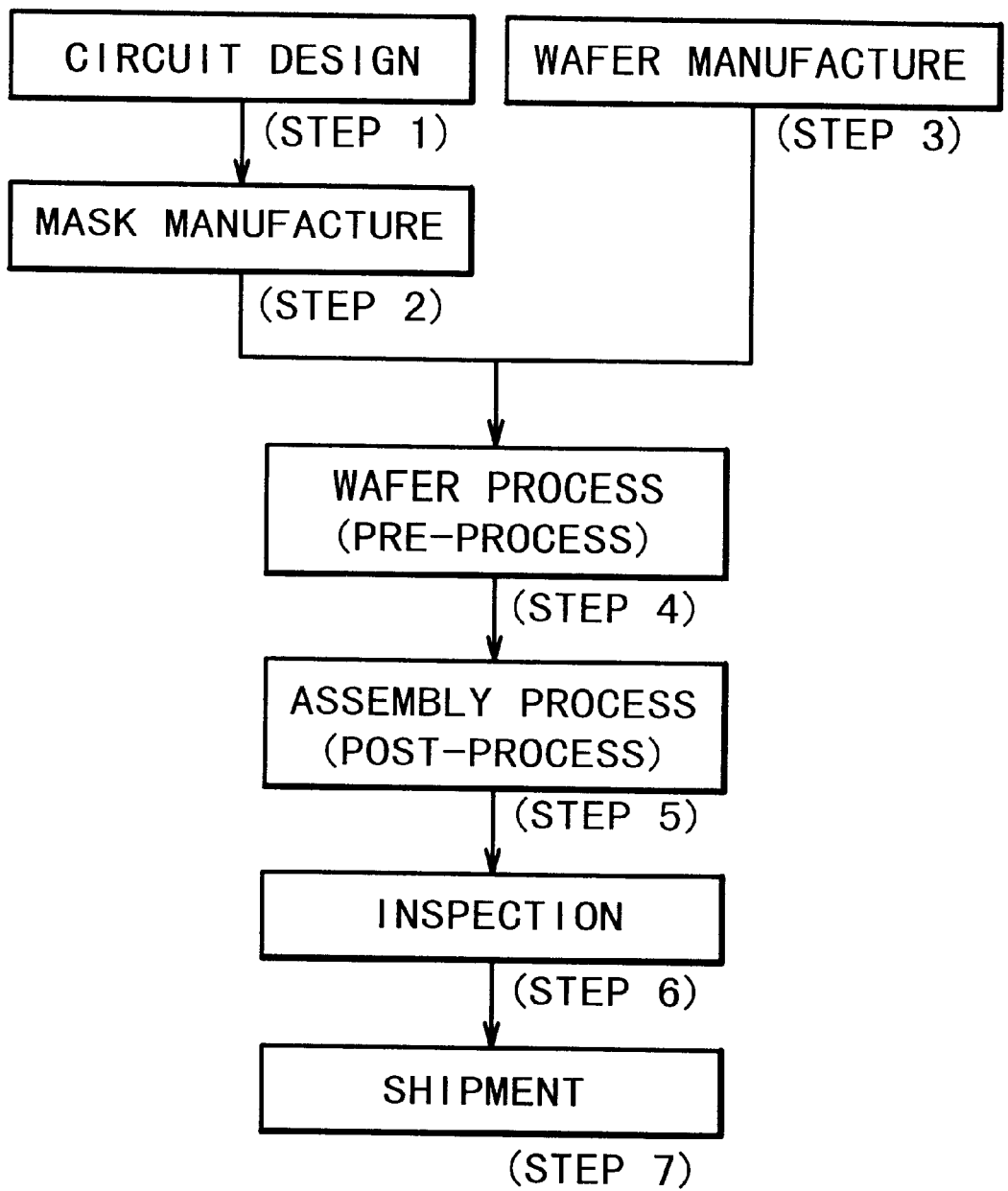
FIG. 15 is a flow chart of device manufacturing processes.

FIG. 15 is a flow chart of a procedure for the manufacture of microdevices such as semiconductor chips (e.g., Ics or LSIs), liquid crystal panels, CCDs, thin film magnetic heads or micro-machines, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the so prepared mask and wafer, circuits are practically formed on the wafer through lithography. Step 5 subsequent to this is an assembling step which is called a post-process wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 16:
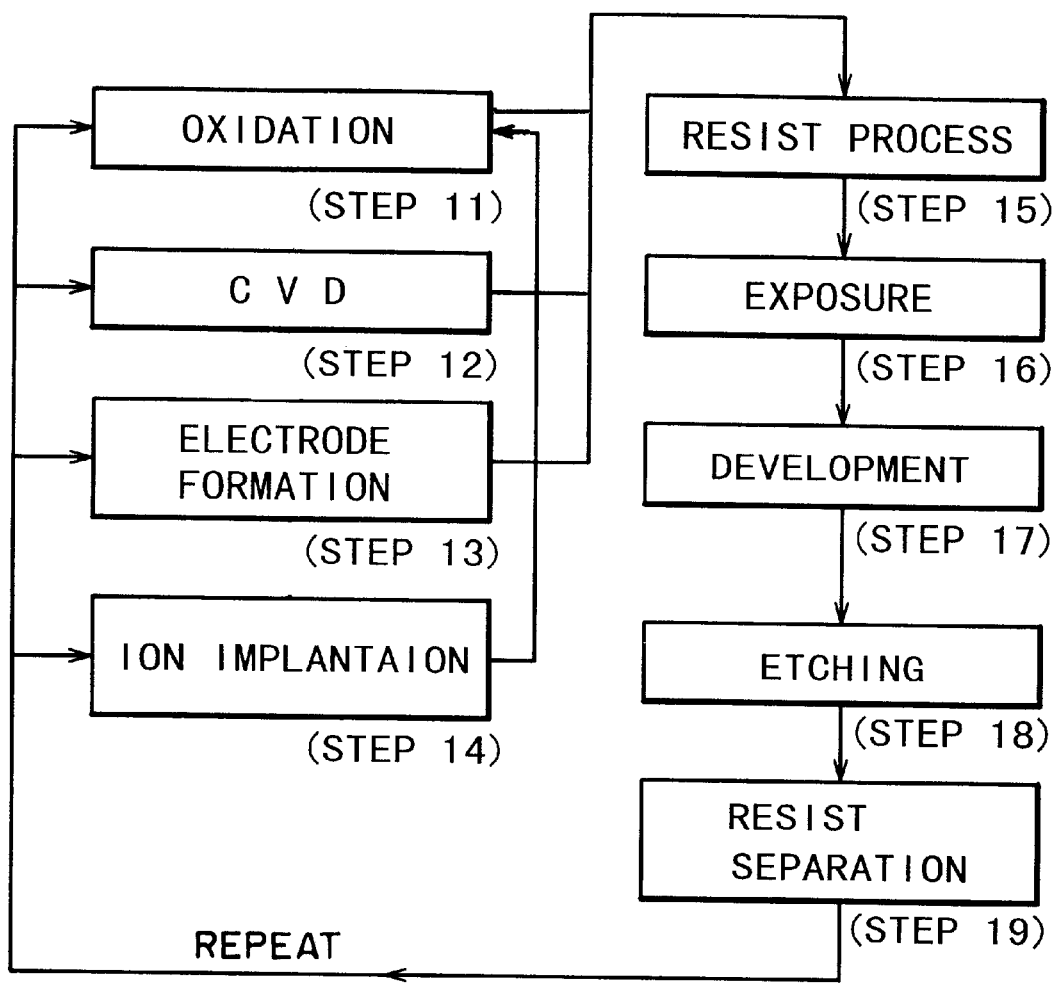
FIG. 16 is a flow chart for explaining details of a wafer process.
Figure 17:
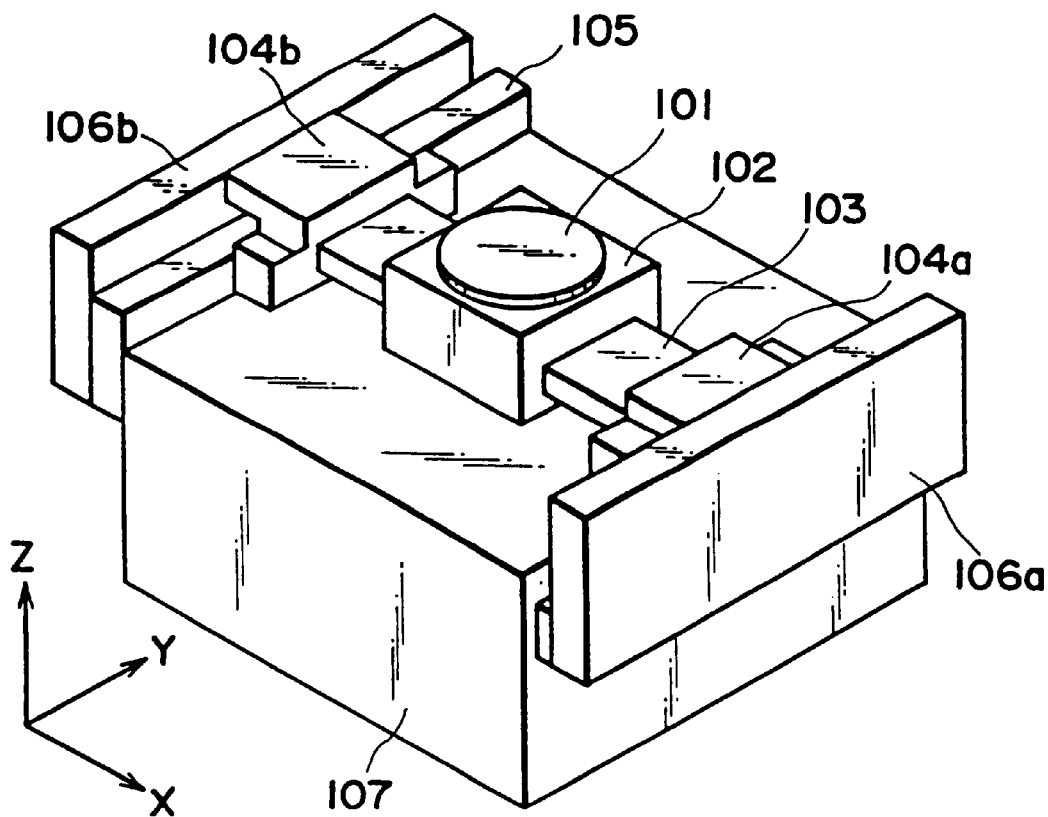
FIG. 17 is a schematic and perspective view of a stage system of a known type.
Figure 18:
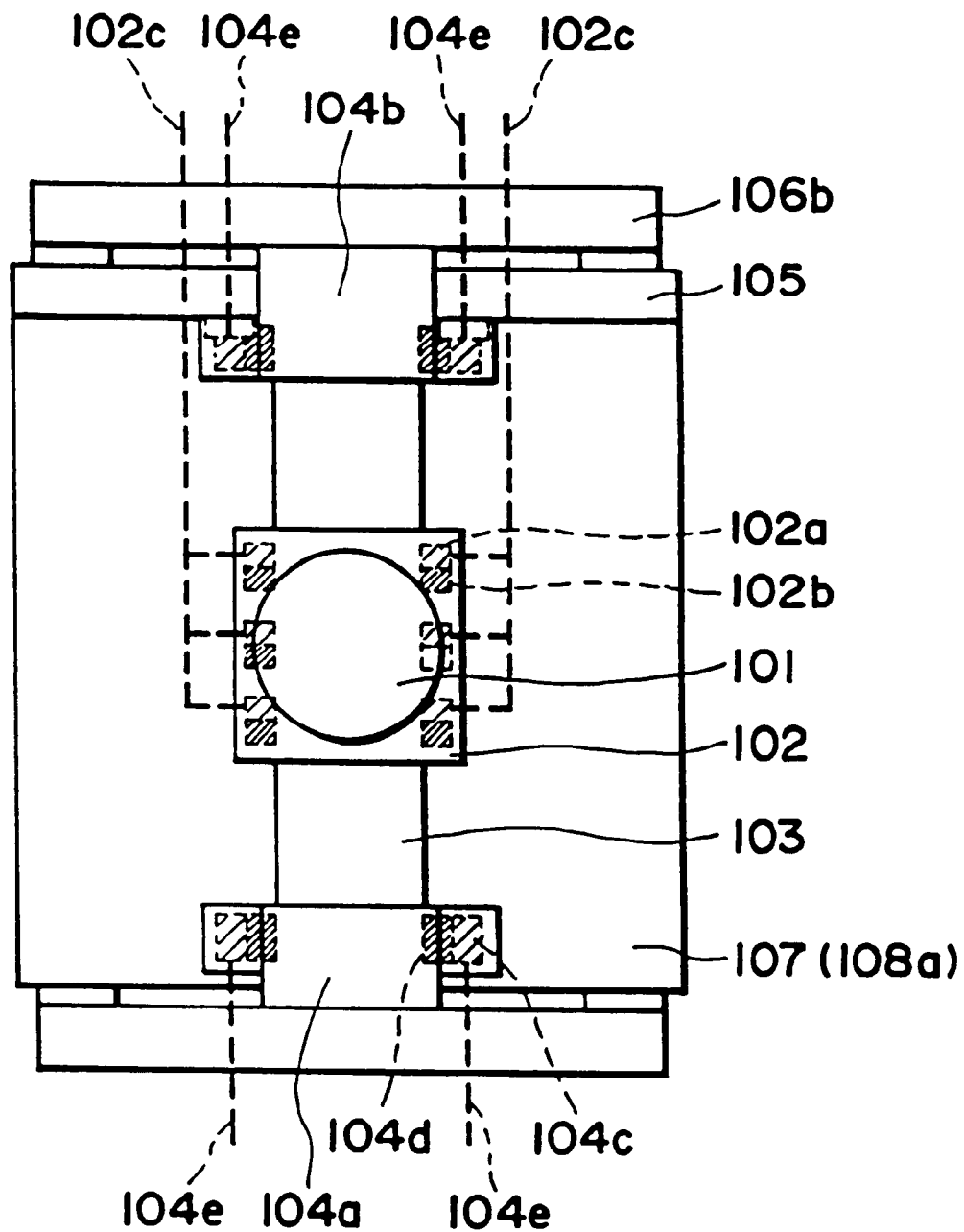
FIG. 18 is a schematic view of a portion of the structure of a stage system of a known type.

FIG. 16 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

In accordance with the embodiments of the present invention as described hereinbefore, a stage base has an accumulation structure made of suitably selected materials, which enables an improved stage system low in cost, light in weight and still high in rigidity.

In other words, it provides a stage base light in weight, small in thickness and high in rigidity, wherein deformation of the stage base due to movement of a movable portion is small. Additionally, the weight of the stage system can be reduced considerably. This effectively enlarges the latitude of rigidity of a structure that supports the stage system. Thus, it accomplishes a stage system by which movement of a stage movable portion can be controlled precisely.

Further, the influence of magnetic hysteresis loss due to movement of a movable portion is reduced, and thus, loss of linear motor thrust is made small. This accomplishes a stage system which is of low power consumption and low heat generation and, additionally, which provides stable stage movement control.

Particularly, when the present invention is applied to a scan type exposure apparatus, because of the reduction of influence of magnetic hysteresis loss due to movement of a movable portion, exposure transfer precision in scan exposure wherein exposure is performed while moving a reticle stage and a wafer stage in synchronism, can be improved particularly and significantly. This facilitates production of high precision devices.

While the invention has been described with reference to the structures disclosed herein, it is not confined to the details set forth and this application is intended to cover such modifications or changes as may come within the purposes of the improvements or the scope of the following claims.

What is claimed is:

1. A stage system, comprising:
    a movable stage having a static bearing;
    a magnet preloading mechanism having a magnet and being provided at said movable stage, said magnet preloading mechanism being effective to apply a preload to said movable stage; and
    a base having a guiding surface for guiding said movable stage, wherein said base has an accumulated structure including a first layer of a magnetic material provided at the guiding surface side, and a second layer of a non-magnetic material.

2. A stage system according to claim 1, wherein the second layer is made of a material having a specific gravity less than that of the magnetic material.

3. A stage system according to claim 1, wherein the second layer is made of a material having a Young's modulus greater than that of the magnetic material.

4. A stage system according to claim 1, wherein the material of the first layer is a permalloy or silicon steel.

5. A stage system according to claim 1, wherein the material of the second layer is ceramics.

6. A system according to claim 1, wherein the first layer is made of a permalloy or silicon steel material provided at the guiding surface side, and the second layer is made of ceramics material.

7. A stage system according to claim 6, wherein the ceramics material includes one of alumina ceramics, silicon nitride ceramics, zirconia, and silicon carbide.

8. A stage system according to claim 1, further comprising means for bonding the first and second layers to each other on the basis of vacuum attraction.

9. A stage system according to claim 8, wherein the bonding between the first and second layers is releasable.

10. A stage system according to claim 9, wherein the bonding is performed when an ambient temperature becomes substantially constant.

11. A stage system according to claim 1, further comprising a third layer, below the second layer, of a material having a thermal expansion coefficient equivalent to that of the first layer.

12. A stage system according to claim 11, wherein the layers are bonded to each other on the basis of a high melting point metal bonding method.

13. A stage system according to claim 1, wherein the second layer has one of a bored rib structure and a hollow structure.

14. A stage system according to claim 1, further comprising means for bonding the first and second layers to each other on the basis of electromagnetic attraction.

15. A stage system according to claim 9, wherein the bonding is performed when said stage system is placed movable.

16. A stage system according to claim 9, wherein the bonding is performed in response to a signal from a stage control system.

17. A stage system according to claim 15, wherein the bonding between the first and second layers is releasable.

18. A stage system according to claim 17, wherein the bonding is performed when an ambient temperature becomes substantially constant.

19. A stage system according to claim 17, wherein the bonding is performed when said stage system is placed movable.

20. A stage system according to claim 17, wherein the bonding is performed in response to a signal from a stage control system.

21. A stage system according to claim 11, wherein the layers are bonded to each other on the basis of an activated metal bonding method.

22. A stage system according to claim 21, wherein the layers are bonded to each other on the basis of an oxidation bonding method.

23. A stage system according to claim 21, wherein the layers are bonded to each other on the basis of an adhesion bonding method.

24. An exposure apparatus, comprising:
    an exposure device for exposing a substrate;
    a movable stage having a static bearing;
    a magnet preloading mechanism having a magnet and being provided at said movable stage, said magnet preloading mechanism being effective to apply a preload to said movable stage; and
    a base having a guiding surface for guiding said movable stage, wherein said base has an accumulated structure having a first layer of a magnetic material provided at the guiding surface side, and a second layer of a non-magnetic material.

25. An apparatus according to claim 24, wherein said movable stage is provided for at least one of a reticle stage for holding a reticle and a wafer stage for holding a wafer.

26. An apparatus according to claim 25, wherein said reticle stage and said wafer stage are scanningly moved relative to a projection optical system and at a predetermined speed ratio, whereby a pattern of the reticle is transferred to the wafer.

27. A device manufacturing method, comprising the steps of:
    providing an exposure apparatus as recited in claim 24; and
    performing an exposure process by use of the exposure apparatus.

28. A method according to claim 27, further comprising applying a resist to the wafer before the exposure process, and developing the wafer after the exposure process.

* * * * *

UNITED STATES PATENT AND TRADEMARK OFFICE
CERTIFICATE OF CORRECTION

PATENT NO.    : 6,320,649 B1
DATED         : November 20, 2001
INVENTOR(S)   : Yoshikazu Miyajima et al.

It is certified that error appears in the above-identified patent and that said Letters Patent is hereby corrected as shown below:

Drawings,
Figure 16, in "(Step S14)," "IMPLANTAION" should read -- IMPLANTATION --.

Column 4,
Line 31, "system," should read -- stage system, --.
Line 66, "preloading" should read -- The preloading --.

Column 5,
Line 65, "different." should read -- difference. --

Column 6,
Line 4, "the materials of them," should read -- their materials, --.
Line 20, "expansion deforma-" should read -- their expansion deforma- --.
Line 21, "tion of them" should read -- tion, --.

Column 7,
Line 9, "He" should read -- Hc --.

Column 8,
Line 1, "lyophilic" should read -- lyophilic properties --.
Line 16, "and" should read -- with --.
Line 25, "on" should be deleted.
Line 35, "theses surface" should read -- these surfaces --.

Column 10,
Line 12, "Ics" should read -- ICs --.

Signed and Sealed this

Eleventh Day of June, 2002

Attest:

Attesting Officer

JAMES E. ROGAN
*Director of the United States Patent and Trademark Office*